US008630091B2

(12) United States Patent
Ward et al.

(10) Patent No.: US 8,630,091 B2
(45) Date of Patent: Jan. 14, 2014

(54) CARBON NANOTUBES FOR THE SELECTIVE TRANSFER OF HEAT FROM ELECTRONICS

(75) Inventors: Jonathan W. Ward, Fairfax, VA (US); Claude L. Bertin, Venice, FL (US); Brent M. Segal, Woburn, MA (US)

(73) Assignee: Nantero Inc., Woburn, MA (US)

( * ) Notice: Subject to any disclaimer, the term of this patent is extended or adjusted under 35 U.S.C. 154(b) by 447 days.

(21) Appl. No.: 13/090,135

(22) Filed: Apr. 19, 2011

(65) Prior Publication Data

US 2011/0211313 A1 Sep. 1, 2011

Related U.S. Application Data

(63) Continuation of application No. 12/066,063, filed as application No. PCT/US2006/034563 on Sep. 5, 2006, now Pat. No. 7,927,992.

(60) Provisional application No. 60/714,386, filed on Sep. 6, 2005.

(51) Int. Cl.
*H05K 7/20* (2006.01)
*B82Y 99/00* (2011.01)

(52) U.S. Cl.
USPC ........... 361/704; 977/742; 977/932; 977/750; 977/752

(58) Field of Classification Search
None
See application file for complete search history.

(56) References Cited

U.S. PATENT DOCUMENTS

| 6,057,637 | A | 5/2000 | Zettl |
| 6,277,318 | B1 | 8/2001 | Bower |
| 6,342,276 | B1 | 1/2002 | You |
| 6,409,567 | B1 | 6/2002 | Amey, Jr. et al. |
| 6,423,583 | B1 | 7/2002 | Avouris et al. |
| 6,495,116 | B1 | 12/2002 | Herman |
| 6,495,258 | B1 | 12/2002 | Chen et al. |
| 6,515,339 | B2 | 2/2003 | Shin et al. |
| 6,528,020 | B1 | 3/2003 | Dai et al. |
| 6,574,130 | B2 | 6/2003 | Segal et al. |
| 6,630,772 | B1 | 10/2003 | Bower et al. |

(Continued)

FOREIGN PATENT DOCUMENTS

| GB | 2364933 | 2/2002 |
| JP | 11008690 | 1/1999 |

(Continued)

OTHER PUBLICATIONS

Brock, et al., "Carbon Nonvolatile Memories and Fabrics in a Radiation Hard Semiconductor Foundry," 2005 IEEE Conference, 9 pages.

(Continued)

*Primary Examiner* — Seahvosh Nikmanesh
(74) *Attorney, Agent, or Firm* — Nantero Inc.

(57) ABSTRACT

Under one aspect, a method of cooling a circuit element includes providing a thermal reservoir having a temperature lower than an operating temperature of the circuit element; and providing a nanotube article in thermal contact with the circuit element and with the reservoir, the nanotube article including a non-woven fabric of nanotubes in contact with other nanotubes to define a plurality of thermal pathways along the article, the nanotube article having a nanotube density and a shape selected such that the nanotube article is capable of transferring heat from the circuit element to the thermal reservoir.

20 Claims, 9 Drawing Sheets

(56) References Cited

U.S. PATENT DOCUMENTS

| | | |
|---|---|---|
| 6,643,165 B2 | 11/2003 | Segal et al. |
| 6,645,628 B2 | 11/2003 | Shiffler, Jr. et al. |
| 6,706,402 B2 | 3/2004 | Rueckes et al. |
| 6,707,098 B2 | 3/2004 | Hofmann et al. |
| 6,784,028 B2 | 8/2004 | Rueckes et al. |
| 6,808,746 B1 | 10/2004 | Dai et al. |
| 6,833,558 B2 | 12/2004 | Lee et al. |
| 6,835,591 B2 | 12/2004 | Rueckes et al. |
| 6,858,197 B1 | 2/2005 | Delzeit |
| 6,863,942 B2 | 3/2005 | Ren et al. |
| 6,888,773 B2 | 5/2005 | Morimoto |
| 6,890,780 B2 | 5/2005 | Lee |
| 6,899,945 B2 | 5/2005 | Smalley et al. |
| 6,905,892 B2 | 6/2005 | Esmark |
| 6,911,682 B2 | 6/2005 | Rueckes et al. |
| 6,918,284 B2 | 7/2005 | Snow et al. |
| 6,919,592 B2 | 7/2005 | Segal et al. |
| 6,919,740 B2 | 7/2005 | Snider |
| 6,921,575 B2 | 7/2005 | Horiuchi et al. |
| 6,924,538 B2 | 8/2005 | Jaiprakash et al. |
| 6,946,410 B2 | 9/2005 | French et al. |
| 7,057,402 B2 | 6/2006 | Cole et al. |
| 7,927,992 B2 | 4/2011 | Ward et al. |
| 2001/0004979 A1 | 6/2001 | Han et al. |
| 2002/0160111 A1 | 10/2002 | Sun et al. |
| 2003/0004058 A1 | 1/2003 | Li et al. |
| 2003/0122111 A1 | 7/2003 | Glatkowski |
| 2003/0177450 A1 | 9/2003 | Nugent |
| 2003/0180472 A1* | 9/2003 | Zhou et al. ............ 427/430.1 |
| 2003/0200521 A1 | 10/2003 | DeHon et al. |
| 2004/0005723 A1 | 1/2004 | Empedocles et al. |
| 2004/0007528 A1 | 1/2004 | Bakajin et al. |
| 2004/0023253 A1 | 2/2004 | Kunwar et al. |
| 2004/0031975 A1 | 2/2004 | Kern et al. |
| 2004/0041154 A1 | 3/2004 | Watanabe et al. |
| 2004/0043527 A1 | 3/2004 | Bradley et al. |
| 2004/0071949 A1 | 4/2004 | Glatkowski et al. |
| 2004/0099438 A1 | 5/2004 | Arthur et al. |
| 2004/0104129 A1 | 6/2004 | Gu et al. |
| 2004/0132070 A1 | 7/2004 | Star et al. |
| 2004/0181630 A1 | 9/2004 | Jaiprakash et al. |
| 2004/0253167 A1 | 12/2004 | Silva et al. |
| 2004/0265550 A1 | 12/2004 | Glatkowski et al. |
| 2004/0266106 A1 | 12/2004 | Lee |
| 2005/0053525 A1 | 3/2005 | Segal et al. |
| 2005/0062035 A1 | 3/2005 | Bertin et al. |
| 2005/0095938 A1 | 5/2005 | Rosenberger et al. |
| 2005/0128788 A1 | 6/2005 | Segal et al. |
| 2005/0139991 A1 | 6/2005 | White et al. |
| 2005/0145367 A1 | 7/2005 | Hannah et al. |
| 2005/0212014 A1 | 9/2005 | Horibe et al. |
| 2006/0237537 A1 | 10/2006 | Empedocles |
| 2007/0004191 A1 | 1/2007 | Gu et al. |

FOREIGN PATENT DOCUMENTS

| | | |
|---|---|---|
| JP | 11210336 | 7/1999 |
| JP | 2002258885 | 4/2002 |
| WO | WO-98/39250 | 9/1998 |
| WO | WO-99/65821 | 12/1999 |
| WO | WO-01/03208 | 1/2001 |
| WO | WO-02/45113 | 6/2002 |
| WO | WO-02/48701 | 6/2002 |
| WO | WO-03/016901 | 2/2003 |
| WO | WO-03/034142 | 4/2003 |
| WO | WO-2004/012932 | 2/2004 |
| WO | WO-2008/054364 | 5/2008 |

OTHER PUBLICATIONS

Rosendale, et al., "A 4 Megabit Carbon Nanotube-based Nonvolatile Memory (NRAM)," ESSCIRC 2010 Proceedings, pp. 478-481.
Rueckes, et al., "Carbon Nanotube-Based Nonvolatile Random Access Memory for Molecular Computing," Science, 2000, vol. 289, pp. 94-97.
Ward, et al., "A Non-Volatile Nanoelectromechanical Memory Element Utilizing a Fabric of Carbon Nanotubes," IEEE 2004, pp. 34-38.
Ago, et al., "Workfunction of Purified and Oxidized Carbon Nanotubes," Synthetic Metals, vol. 103, 1999, pp. 2494-2495.
Ajayan, et al., "Applications of Carbon Nanotubes," Topics Appl. Phys., vol. 80, 2001, pp. 391-425.
Ajayan, et al., "Nanometre-size tubes of carbon," Rep. Prog. Phys., vol. 60, 1997, pp. 1025-1062.
Awano, Y., "Graphene for VLSI: FET and Interconnect Applications," IEDM 2009 Technical Digest, pp. 10.1.1-10.1.4.
Banerjee, et al., "Functionalization of Carbon Nanotubes with a Metal-Containing Molecular Complex," Nano Letters, vol. 2, No. 1, 2002, pp. 49-53.
Berber, et al., "Unusually High Thermal Conductivity of Carbon Nanotubes," Phys. Rev. Ltrs., vol. 84, No. 20, May 15, 2000, pp. 4613-4616.
Berhan, et al., "Mechanical Properties of Nanotube Sheets: Alterations in Joint Morphology and Achievable Moduli in Manufacturable Materials," J. Appl. Phys., vol. 95, No. 8, Apr. 2004, pp. 4335-4345.
Bonard, et al., "Monodisperse Multiwall Carbon Nanotubes Obtained with Ferritin as Catalyst," Nano Letters, vol. 2, No. 6, 2002, pp. 665-667.
Brown, K. M., "System in package "The Rebirth of SIP"," 2004 IEEE Custom Integrated Circuits, May 2004, 6 pages.
Cassell, et al., "Large Scale CVD Synthesis of Single-Walled Carbon Nanotubes," J. Phys. Chem. B, vol. 103, 1999, pp. 6484-6492.
Che, et al., "Thermal conductivity of carbon nanotubes," Nanotechnology, 2000, pp. 65-69.
Chen, et al., "Heterogeneous Single-Walled Carbon Nanotube Catalyst Discovery and Optimization," Chem. Mater., vol. 14, 2002, pp. 1891-1896.
Cheng, H.M., "Large-Scale and Low-Cost Synthesis of Single-Walled Carbon Nanotubes by the Catalytic Pyrolysis of Hydrocarbons," Appl. Phys. Ltrs., vol. 72, No. 25, Jun. 1998, pp. 3282-3284.
Chiang, et al., "Purification and Characterization of Single-Wall Carbon Nanotubes (SWNTs) Obtained from the Gas-Phase Decomposition of CO (HiPco Process)," J. Phys. Chem. B, vol. 105, 2001, pp. 1157-1161.
Crowley, et al., "512 Mb PROM with 8 layers of antifuse/Diode cells," IEEE International Solid-State Circuits Conference, vol. XLVI, Feb. 2003, pp. 284-285.
Cui, et al., "Carbon Nanotube Memory Devices of High Charge," Applied Phys. Ltrs., vol. 81, No. 17, Oct. 2002, pp. 3260-3262.
Dai, et al., "Controlled Chemical Routes to Nanotube Architectures, Physics, and Devices," J. Phys. Chem. B, vol. 103, 1999, pp. 11246-11255.
Delzeit, et al., "Multilayered Metal Catalysts for Controlling the Density of Single-Walled Carbon Nanotube Growth," Chem. Phys. Ltrs., vol. 348, 2001, pp. 368-374.
Desai, et al., "Freestanding Carbon Nanotube Specimen Fabrication," Proceeding 2005 5th IEEE Conference on Nanotechnology, Nagoya, Japan, Jul. 2005.
European Patent Application No. 06851819.0, European Search Report included in Australian Examination Report dated Jan. 28, 2011, 1 page.
Franklin, et al., "An Enhanced CVD Approach to Extensive Nanotube Networks with Directionality," Adv. Mater., vol. 12, No. 12, 2000, pp. 890-894.
Fuhrer, et al., "High-Mobility Nanotube Transistor Memory," Nano Letters, vol. 2, No. 7, 2002, pp. 755-759.
Haddon, et al., "Purification and Separation of Carbon Nanotubes," MRS Bulletin, Apr. 2004, pp. 252-259 (www.mrs.org/publicatons/bulletins).
Hafner, et al., "Catalytic Growth of Single-Wall Carbon Nanotubes from Metal Particles," Chem. Phys. Ltrs., vol. 296, 1998, pp. 195-202.
Homma, et al., "Single-Walled Carbon Nanotube Growth on Silicon Substrates Using Nanoparticle Catalysts," JPN, J. Appl. Phys., vol. 41, 2002, pp. L89-L91.
Hone, et al., "Thermal conductivity of single-walled carbon nanotubes," Synthetic Metals, vol. 103, 1999, pp. 2498-2499.

(56) References Cited

OTHER PUBLICATIONS

Huai, Y., "Spin-Transfet Torque MRAM (STT-MTAM): Challenges and Prospects," AAPS Bulletin, vol. 18, No. 6, Dec. 2008, pp. 33-40.

International Search Report, International Patent Application No. PCT/US05/18467 dated Oct. 1, 2007, 5 pages.

International Search Report, International Patent Application No. PCT/US05/18539 dated Sep. 18, 2006, 4 pages.

International Search Report, International Patent Application No. PCT/US05/45316 dated Sep. 6, 2005, 2 pages.

Jeong, et al., "A Purification Method of Single-Wall Carbon Nanotubes Using H2S and 02 Mixture Gas," Chem. Phys. Ltrs., vol. 344, Aug. 2001, pp. 18-22.

Jiang, et al., "Performance Breakthrough in 8nm Gate-All-Around Length Gate-All Around Nanowire Transistors using Metallic Nanowire Contacts," 2008 Symposium on VLSI Technology Digest of Technical Papers, pp. 34-35.

Joselevich, et al., "Vectorial Growth of Metallic and Semiconducting Single-Wall Carbon Nanotubes," Nano Letters, vol. 0, No. 0, A-E, 2002.

Khan, et al., "Solubilization of Oxidized Single-Walled Carbon Nanotube in Organic and Aqueous Solvents through Organic Derivatization," Nano Letters, vol. 2, No. 11, 2002, pp. 1215-1218.

Kianian, et al., "A 3D Stackable Carbon Nanotube-based Nonvolatile Memory (NRAM)," ESSDERC, Nantero, Inc., Jun. 14, 2010, 4 pages.

Kong, et al., "Chemical Vapor Deposition of Methane for Single-Walled Carbon Nanotubes," Chem. Phys. Ltrs., vol. 292, Aug. 1998, pp. 567-574.

Kong, et al., "Nanotube Molecular Wires as Chemical Sensors," Science, vol. 287, Jan. 2000, pp. 622-625.

Li, et al., "Carbon Nanotube Nanoelectrode Array for Ultrasensitive DNA Detection," Nano Letters, vol. 3, No. 5, 2003, pp. 597-602.

Li, et al., "Growth of Single-Walled Carbon Nanotubes from Discrete Catalytic Nanoparticles of Various Sizes," J. Phys. Chem. B, vol. 105, 2001, pp. 11424-11431.

Li, et al., "Preparation of Monodispersed Fe—Mo Nanoparticles as the Catalyst for CVD Synthesis of Carbon Nanotubes," Chem. Mater., vol. 13, 2001, pp. 1008-1014.

Nerushev, et al., "Carbon Nanotube Films Obtained by Thermal Chemical Vapour Deposition," J. Mater. Chem., vol. 11, 2001, pp. 1122-1132.

Niu, et al., "High Power Electrochemical Capacitors Based on Carbon Nanotube Electrodes," Appl. Phys. Ltrs., vol. 70, No. 11, Mar. 1997, pp. 1480-1482.

Novak, et al., "Nerve Agent Using Networks of Single-Walled Carbon Nanotubes," Appl. Phys. Ltr, vol. 83, No. 19, Nov. 2003, pp. 4026-4028.

Onoa, et al., "Bulk Production of Singly Dispersed Carbon Nanotubes with Prescribed Lengths," Nanotechnology, vol. 16, 2005, pp. 2799-2803.

Osman, et al., "Temperature dependence of the thermal conductivity of single-wall carbon nanotubes," Nanotechnology, vol. 12, 2001, pp. 21-24.

Padgett, et al., "Influence of Chemisorption on the Thermal Conductivity of Single-Wall Carbon Nanotubes," Nano Letters, vol. 4, No. 6, 2004, pp. 1051-1053.

Parikh, et al., "Flexible Vapour Sensors Using Single Walled Carbon Nanotubes," Sensors and Actuators B, vol. 113, 2006, pp. 55-63.

Peigney, et al., "A Study of the Formation of Single- and Double-Walled Carbon Nanotubes by a CVD Method," J. Phys. Chem. B, vol. 105, 2001, pp. 9699-9710.

Qi, et al., "Toward Large Arrays of Multiplex Functionalized Carbon Nanotube Sensors for Highly Sensitive and Selective Molecular Detection," Nano Letters, vol. 3, No. 3, 2003, pp. 347-351.

Servalli, G., "A 45nm Generation Phase Change Memory Technology," IEDM 2009 Technical Digest, pp. 5.7.1-5.7.4.

Shelimov, et al., "Purification of Single-Wall Carbon Nanotubes by Electronically Assisted Filtration," Chem. Phys. Ltrs., vol. 282, 1998, pp. 429-434.

Snow, et al., "Random Networks of Carbon Nanotubes as an Electronic Material," App. Phys. Ltrs., vol. 82, No. 13, Mar. 2003, pp. 2145-2147.

Sotiropoulou, et al., "Carbon Nanotube Array-Based Biosensor," Anal Bioanal Chem, vol. 375, 2003, pp. 103-105.

Star, et al., "Nanoelectronic Carbon Dioxide Sensors," Adv. Mater., vol. 16, No. 22, 2004, pp. 2049-2052.

Star, et al., "Nanotube Optoelectronic Memory Devices," Nano Letters, vol. 4, No. 9, 2004, pp. 1587-1591.

Valentini, et al., "Sensors for sub-ppm NO2 Gas Detection Based on Carbon Nanotube Thin Films," Appl. Phys. Ltrs., vol. 82, No. 6, Feb. 2003, pp. 961-963.

Yao, et al., "High-Field Electrical Transport in Single-Wall Carbon Nanotubes," Phys. Rev. Ltrs., vol. 84, No. 13, Mar. 27, 2000, pp. 2941-2944.

Zhang, et al., "Metal Coating on Suspended Carbon Nanotubes and its Implications to Metal-tube Interaction," Chem. Phys. Ltrs., vol. 331, 2000, pp. 35-41.

Zhang, et al., "Select Pathways to Carbon Nanotube Film Growth," Adv. Mater., vol. 13, No. 23, Dec. 2001, pp. 1767-1770.

Zhang, et al., "Formation of Metal Nanowires on Suspended Single-Walled Carbon Nanotubes," Appl. Phys. Ltrs., vol. 77, No. 19, Nov. 2000, pp. 3015-3017.

Zhao, et al., "Frequency-Dependent Electrical Transport in Carbon Nanotubes," Phys. Review B, vol. 64, 2001, pp. 201402-1-201402-4.

Zhou, et al., "p-Channel, n-Channel Thin Film Transistors and p-n Diodes Based on Single Wall Carbon Nanotube Networks," Nano Letters, vol. 4, No. 10, 2004, pp. 2031-2035.

\* cited by examiner

CARBON NANOTUBES FOR THE SELECTIVE TRANSFER OF HEAT FROM ELECTRONICS

CROSS-REFERENCE TO RELATED APPLICATIONS

This application is a continuation of and claims priority under 35 U.S.C. §120 to U.S. patent application Ser. No. 12/066,063, now U.S. Pat. No. 7,927,992, filed on Mar. 6, 2008, and entitled "Carbon Nanotubes for the Selective Transfer of Heat from Electronics," which was a national stage application under 35 U.S.C. §371 of PCT/US06/034563, filed on Sep. 5, 2006, entitled "Carbon Nanotubes for the Selective Transfer of Heat from Electronics," which claimed the benefit under 35 U.S.C. §119(e) of U.S. Provisional Patent Application No. 60/714,386, filed on Sep. 6, 2005, entitled "Carbon Nanotubes for the Selective Transfer of Heat from Electronics," the entire contents of which are incorporated herein by reference.

BACKGROUND

1. Technical Field

The present application relates generally to nanotube fabrics and methods of making same.

2. Discussion of Related Art

As ultra-large-scale-integration of integrated circuits, microelectronic components and devices are becoming increasingly more dense and compact, there exists an increasing need for smaller and more potent heat transfer devices due to the excessive on-chip heat generation. Current integrated circuits used in microprocessors operated at high frequencies use power densities on the order of 50 $W/cm^2$: in comparison, a 60 W light bulb generates 0.5 $W/cm^2$. Such power densities lead to highly localized heating of integrated circuits in areas known as "hot spots".

As the rise in power density increases, the number of "hot spots" on the surface of high power chips increases as observed in microprocessors. Cooling microprocessors is generally necessary to prevent device degradation and to achieve the best possible device performance. A maximum safe temperature for integrated circuit (IC) operation is typically between 100-120° C.

Solving the problems that "hot spots" present is imperative for the next-generation IC packages, as there is an ever-increasing need for smaller-scale devices. Carbon nanotubes (CNTs) are being used in many different applications in the field of electronics and are found to be extremely useful due to their electrical, mechanical, optical, chemical and thermal properties.

Carbon nanotubes, with tube diameters around 1-2 nm, are electrical conductors that are able to carry extremely high current densities. They also have the highest known thermal conductivity, and are also generally thermally and chemically stable. Further details on characteristics of carbon nanotubes may be found in the following references, the entire contents of which are incorporated herein by reference: Z. Yao, C. L. Kane, C. Dekker, Phys. Rev. Lett. 84, 2941 (2000); P. M. Ajayan, T. W. Ebbesen, Rep. Prog. Phys. 60, 1025 (1997); Savas Berber, Young-Kyun Kwon and David Tománek, "Unusually High Thermal Conductivity of Carbon Nanotubes," Phys. Rev. Lett. 84(20), 4613-4616 (2000); Jianwei Che, Tahir Cagin and William A Goddard III, "Thermal conductivity of carbon nanotubes," Nanotechnology, 11, 65-69, 2000; J. Hone, M. Whitney and A Zettl, "Thermal conductivity of single-walled carbon nanotubes," Synthetic Metals, 103-2498-2499, 1999 and Mohamed A Osman and Deepak Srivastava, "Temperature dependence of the thermal conductivity of single-wall carbon nanotubes," Nanotechnology, 12, 21-24, 2001.

Using individual nanotubes for heat transfer, however, can be problematic because of difficulties in growing them with suitably controlled orientation, length, and the like.

There is a need in the art for very efficient, very small, even submicron-sized, heat transfer elements which are easily fabricated and are compatible with electronics applications and fabrication techniques. There is likewise a need in the art for large scale fabrication methods of heat transfer devices used for electronic applications in the semiconductor industry which can be monolithically integrated into a CMOS or similar process flow to fabricate integrated circuits. Naturally, the uses of such elements extend to most types of consumer electronics where heat transfer in integrated elements is beneficial.

SUMMARY

The present invention provides carbon nanotubes for the selective transfer of heat from electronics.

Under one aspect, a method of cooling a circuit element includes providing a thermal reservoir having a temperature lower than an operating temperature of the circuit element; and providing a nanotube article in thermal contact with the circuit element and with the reservoir, the nanotube article including a non-woven fabric of nanotubes in contact with other nanotubes to define a plurality of thermal pathways along the article, the nanotube article having a nanotube density and a shape selected such that the nanotube article is capable of transferring heat from the circuit element to the thermal reservoir.

One or more embodiments include one or more of the following features. Providing the nanotube article includes depositing pre-formed nanotubes on a surface so as to form the non-woven fabric of nanotubes. Depositing pre-formed nanotubes includes at least one of spin-coating pre-formed nanotubes and spray-coating pre-formed nanotubes. Providing the nanotube article includes growing nanotubes on a surface so as to form the non-woven fabric of nanotubes.

Further including defining the shape of the nanotube article lithographically. Defining the shape of the nanotube article lithographically includes forming a non-woven fabric of nanotubes and subsequently removing selected portions of that non-woven fabric of nanotubes in accordance with the shape. Providing the nanotube article includes conformally forming a non-woven nanotube fabric over the circuit element. The nanotube article has a substantially planar shape. Further including providing a substrate having a substantially planar major surface and a feature not in the plane of the major surface, and wherein the nanotube article substantially conforms to said feature. Further including providing supports under the nanotube article, the supports defining a gap over which the nanotube article is suspended. The nanotube density and shape are selected such that the nanotube article is capable of transferring heat from the circuit element to the thermal reservoir at a pre-defined rate selected to maintain the circuit element below a pre-specified temperature. The pre-specified temperature includes an upper limit of a normal operating temperature. The nanotube article further has a pre-defined composition. The pre-defined composition includes single-walled nanotubes. The pre-defined composition includes multi-walled nanotubes. The circuit element includes at least a portion of an integrated circuit. The circuit element includes an encapsulation material. The thermal reservoir includes a heat sink. The heat sink includes a plurality of fins that radiate heat. Further including a thermally conductive material between and in thermal contact with each of the nanotube article and the circuit element.

Under another aspect, a method of forming a thermal management structure for an integrated circuit includes depositing a layer of pre-formed nanotubes on a defined region of the integrated circuit, the layer substantially conforming to the defined region of the integrated circuit and including a plurality of nanotubes; and providing a thermal reservoir in thermal contact with at least a portion of the layer of nanotubes, wherein the layer of pre-formed nanotubes has a nanotube density selected such that the nanotube article is capable of transferring heat from the integrated circuit to the thermal reservoir.

One or more embodiments includes one or more of the following features. Depositing the layer of pre-formed nanotubes includes at least one of spin-coating and spray-coating pre-formed nanotubes onto the defined region of the integrated circuit. Further including patterning the layer of pre-formed nanotubes to provide defined regions of nanotubes over pre-selected portions of the integrated circuit. The defined regions of nanotubes are each in thermal contact with the thermal reservoir. The pre-selected portions of the integrated circuit include portions of the circuit needing cooling during operation. The pre-selected portions of the integrated circuit include individual devices within the integrated circuit. The pre-selected portions of the integrated circuit include active regions of the integrated circuit. The layer of pre-formed nanotubes includes providing a patterned mask over the layer of pre-formed nanotubes and removing a portion of the layer of pre-formed nanotubes in accordance with the patterned mask. Patterning the layer of pre-formed nanotubes further includes defining at least one of a memory element, a heat emitter, a channel in a field effect transistor, a gate in a field effect transistor, a relay, a conductor, and a sensor within the layer of pre-formed nanotubes. Further including patterning the layer of pre-formed nanotubes to define regions of modified thermal conductivity. Further including functionalizing at least a portion of the nanotubes of the layer of pre-formed nanotubes. The integrated circuit is substantially encapsulated. The integrated circuit is substantially complete before depositing the nanotube layer thereon. Further including providing a second integrated circuit over the previously mentioned integrated circuit with the layer of pre-formed nanotubes there between, the layer of pre-formed nanotubes being in thermal contact with the second integrated circuit. The nanotubes of the layer of pre-formed nanotubes includes define a plurality of thermal pathways within the layer of pre-formed nanotubes. The layer of pre-formed nanotubes includes a non-woven fabric of entangled nanotubes. At least some of the nanotubes of the layer of pre-formed nanotubes have a length of at least 100 nm. The layer of pre-formed nanotubes has a thickness between about 1 nm and about 100 nm. The layer of pre-formed nanotubes is substantially a monolayer of nanotubes. The defined region of the integrated circuit includes the top surface of the integrated circuit.

DETAILED DESCRIPTION

Figure 1:
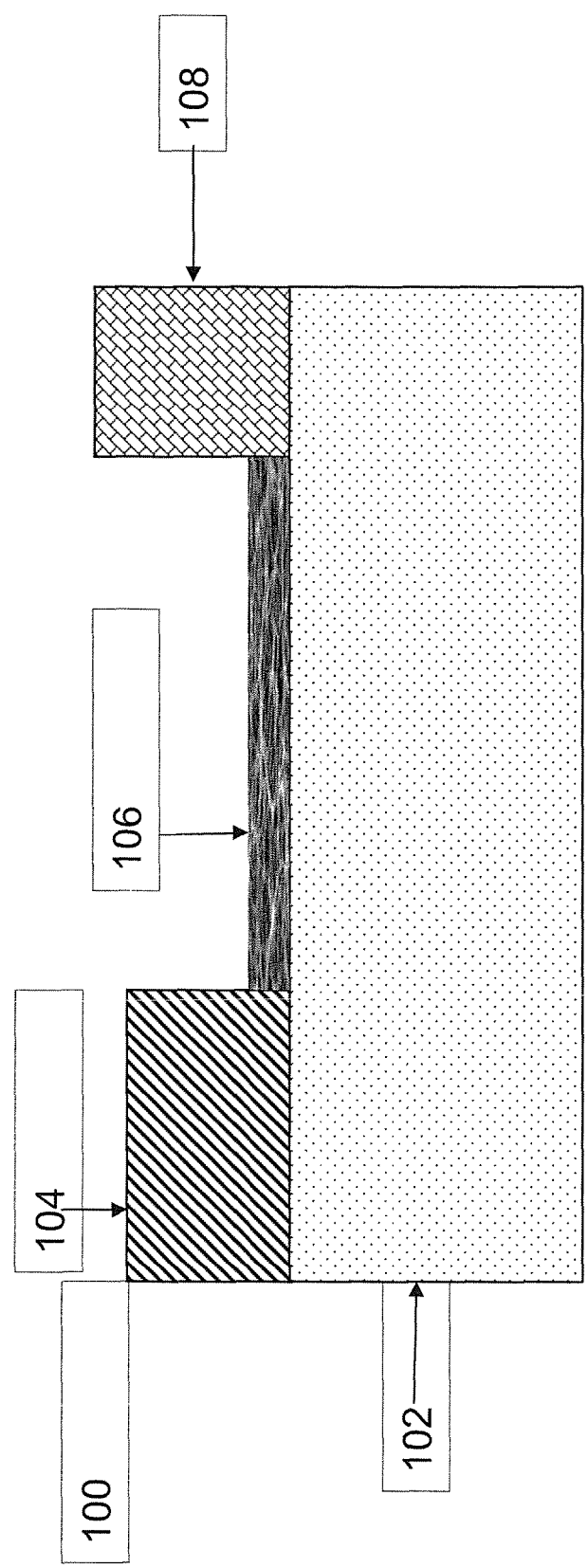
FIG. 1 illustrates an embodiment of a lateral heat transfer structure.

Non-woven fabrics of carbon nanotubes (CNTs) can help manage the problem of thermal "hot spots" and heat transfer in high power devices. CNT fabrics have superior thermal conductance relative to single nanotube as well as to conventional conductive materials such as metals, and therefore the CNT fabrics have a tremendous potential for providing extremely efficient heat transfer. CNTs exhibit a very high "axial" thermal conductivity. For a discrete multiwalled nanotube (MWNT), the thermal conductivity is expected to surpass 3000 W/m-k along the tube axis, while theoretical studies of single walled nanotubes (SWNTs) have shown that thermal conductivities of 6600 W/m-K are possible. CNT fabrics can be used as effective heat-sinks, which are able to remove large amounts of heat away from critical "hot spots".

Preferred embodiments of this invention use CNT fabrics for the transfer of heat away from heat sensitive areas in an electronic circuit or from an entire electronic chip. Similar to other carbon allotropes, CNTs have a high thermal conductivity, where thermal conductivity is defined as the ability of a material to remove heat by a relationship between the negative temperature gradient and the ratio of the heat flow rate per unit area. Thermal conductivity is defined by the equation $$\frac{\partial Q}{\partial t}\frac{1}{A} = -\kappa\frac{\partial T}{\partial x},$$

where κ is the thermal conductivity of the material, Q is the quantity of heat in Joules, t is time in seconds, A is area-m$^2$, temperature (T) is measured in degrees K, and x is measured in meters. The thermal conductivity of a material is dictated by electronic and/or phonon propagation and the thermal conductivity of materials will add in parallel; therefore, for multiple metal lines in parallel, the heat transfer rate can be calculated by using equation:

$$\frac{dQ}{dt} = \left(\frac{k_1 A_1}{d_1} + \frac{k_2 A_2}{d_2} + \ldots + \frac{k_n A_n}{d_n}\right) \times (T_2 - T_1).$$

Unlike the other forms of carbon, the thermal conductivity of nanotubes is confined along the axis of the nanotube due to its 1-D structure. The thermal conductivity of CNTs is theoretically predicted to be greater than about 2000 W/m-K, with values of 6600 W/m-K possible, while experimental measurements have demonstrated thermal conductivity of greater than about 200 W/m-K at room temperature comparable to bulk Cu (about 400 W/m-K) and bulk Al (about 300 W/m-K) at room temperature. The disparity between theoretical and experimental results is typically attributed to deformations along the structure of the CNTs and the effects of non-ideal contacts and test set-up for the measuring of thermal conductivity. Unlike high thermal conductivity metals, CNTs are easily deposited and patterned to nanometer dimensions, the thermal conductivity of the nanotubes do not decrease with increased temperature (typically up to about 500 K) and CNTs have a high melting point (typically over about 3000 K). SWNTs also typically possess the ability to carry a high current density (e.g., over about $10^9$ A/cm$^2$) and the nanotubes do not readily react/diffuse with their surroundings, unlike conventional highly thermally conductive materials such as metals. The combination of these unique properties makes CNT fabrics useful for the thermal management of heat sensitive areas on a semiconductor chip, 3-D stacked wafers and other applications where removal of heat is required.

CNT fabrics have several features that can be useful for heat transfer and are not generally available with conventional heat transfer technologies. First, the very layer of fabric used to make the heat transfer element can also be used to make other electronic elements on the same substrate. For example, a single CNT fabric can be patterned to produce different regions that may be utilized, e.g., as heat transfer media, memory elements, heat emitters, channels or gates in field effect transistors, relays, conductors, electrical insulators, and/or sensors, or a plethora of other types of elements depending on how the sections of the fabric are patterned and processed. Examples of nanotube fabric devices and methods of making same may be found in the incorporated patent references, given below. Second, VLSI arrays of these CNT heat transfer fabrics can be formed using patterning technology at minimum dimensions of the lithography node used, e.g., giga-sized CNT heat emitter arrays can be fabricated at 180 nm or smaller critical feature size. Such methods are more fully described in the incorporated patent references. Third, such nanofabric-based heat transfer fabrics devices scale directly with the lithographic ground rule used, such that, e.g., 180 nm, 130 nm, 90 nm and 65 nm sized emitters can be produced.

Under certain embodiments of the invention, the heat transfer articles may be made from a nanotube non-woven fabric, layer or film, typically of entangled or matted nanotubes, which in some cases may be patterned into ribbons or belts. Creating ribbons or belts (more generally referred to as "traces") of patterned nanotube fabrics overcomes many of the difficulties that may arise in attempting to grow "aligned" CNTs with controlled orientation, length, and the like. Creating traces from nanotube fabrics allows the traces to retain many if not all of the benefits of individual nanotubes. Moreover, traces made from nanotube fabric have benefits not found in individual nanotubes. For example, since the traces include many nanotubes in aggregation, the traces will generally not fail as the result of a failure or break of an individual nanotube. Instead, there are many alternate paths through which heat (e.g., phonons) may travel within a given trace. In effect, a trace made from nanotube fabric defines a heat transfer network of individual nanotubes, each of which conducts heat. Moreover, by using nanotube fabrics, layers or films, current technology may be used to create such traces.

Figure 2:
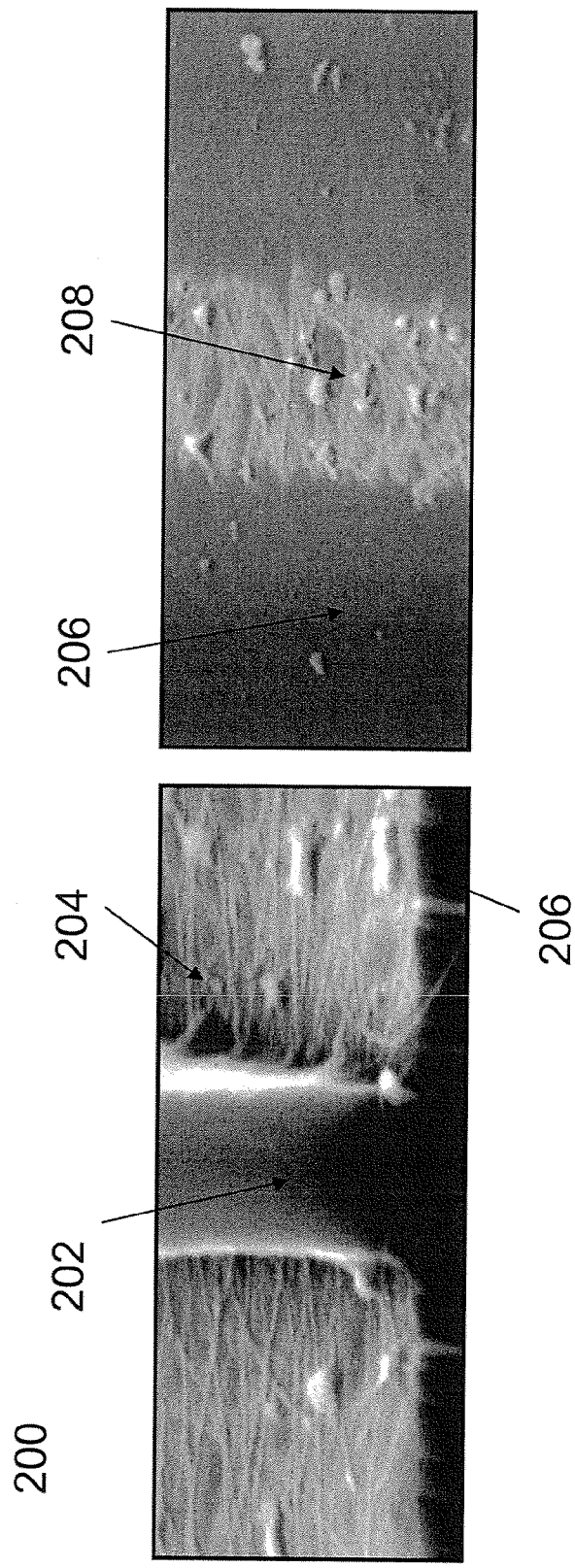
FIGS. 2A and B are micrographs of nanotube fabrics and patterning thereof.

The nanotube fabric may be disposed on the substrate and may be created by spin coating, spray coating, direct growth, or any other appropriate method. After the CNT fabric is deposited, the fabric can be patterned to make heat transfer ribbons, e.g., using standard CMOS lithographic and etching processes. For example, FIG. 2 shows a CNT fabric that has been patterned to have nanometer sized dimensions, here a 250 nm wide CNT pattern (more on this below). Unlike more conventional techniques which typically rely on directed growth or chemical self-assembly of individual nanotubes, preferred embodiments utilize fabrication techniques involving thin films and in most cases, lithography, which allow fabrication over large surface—i.e. >6" silicon based substrates used for electronic circuits. (In contrast, growing individual nanotubes over a distance beyond sub millimeter distances is typically unfeasible.) Exemplary methods of making and patterning nanotube fabrics may be found in the incorporated patent references.

Once the CNT fabric has been patterned, further processing can then be performed, typically without damaging the properties and characteristics of the patterned CNT fabric. For example, the CNT fabric can be exposed to various metal deposition methods, various etching methods and various corrosive and reductive atmospheres, generally without any degradation of the CNT fabric's properties.

CNT fabrics are generally easily manufactured and fabricated using standard front-end and back-end CMOS integration equipment and techniques. Highly conductive metals such as copper, on the other hand, require electro-deposition and Chemical-Mechanical-Planarization (CMP) techniques to create damascene structures to use on the chip; such techniques require large areas of chips. CNTs do not typically require large amounts of surface space and may be easily patterned, e.g., with oxygen plasmas. The thermal conductivity of copper generally decreases with shrinking feature size. In contrast, as the size of CNT fabric-based heat transfer devices decrease, the number of conductive tubes decreases, so the overall thermal conductance (generally the thermal conductivity times cross-sectional area divided by length) decreases, however the individual CNT thermal conductivity remains the same.

The thermal conductivity of a monolayer fabric is generally greater than that of a single carbon nanotube due to the additive effects of the multiple heat conducting tubes. The thermal conductivity of a monolayer fabric is also generally greater than a layer of copper with the same geometry, due to the greater thermal conductivity per cross sectional area of carbon nanotubes as compared to copper. CNTs also do not typically interact with surrounding materials, as copper does. For example, CNTs will not generally diffuse through various material layers and alter/destroy active regions of electronic devices (i.e. the active conductive channel of Si MOS devices), therefore, there is no need to take precautions against this when using CNTs as would be necessary when using copper (which is a deep level trap for silicon).

Figure 3:
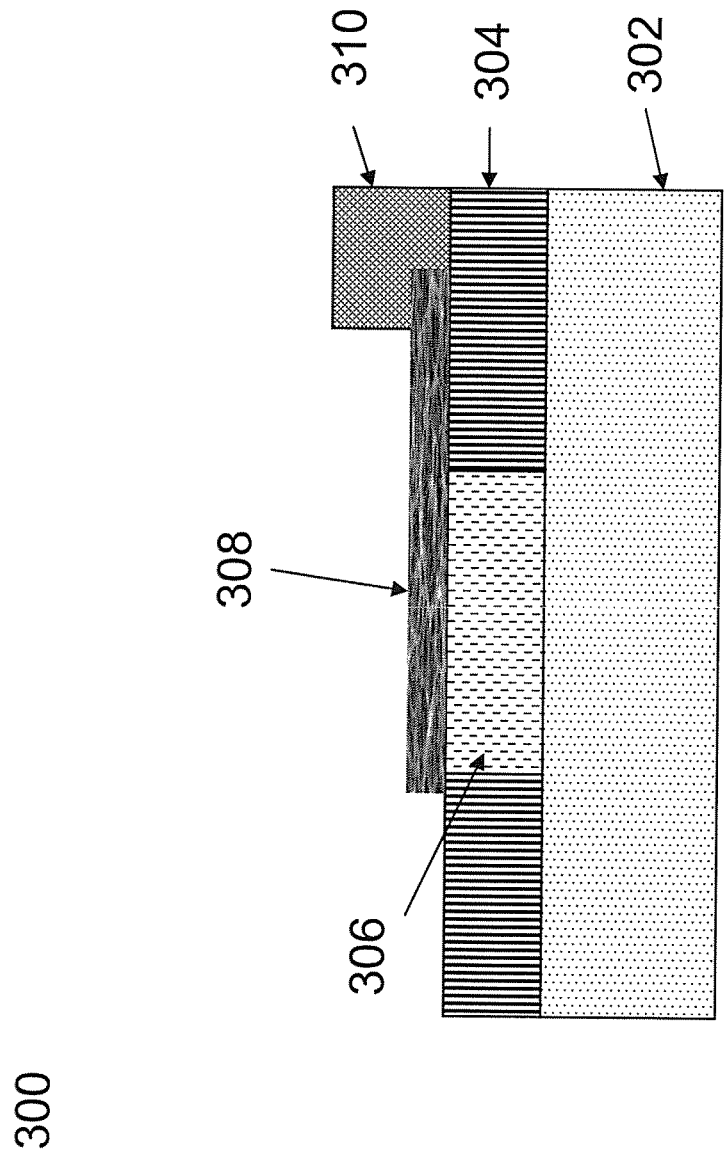
FIG. 3 illustrates an embodiment of a vertical heat transfer structure.

The ability to deposit and pattern the CNT fabric allows for the creation of CNT heat pipes/channels on-chip that can transfer large amounts of thermal power away from sensitive active regions on semiconductor electronics. FIG. 3 illustrates a cross section of an exemplary device.

An embodiment of a simple heat transfer structure 100 is illustrated in FIG. 1. Structure 100 includes a substrate 102, a heat load 104, a heat transfer fabric 106 and a heat reservoir 108. Fabric 106 is in thermal contact with heat load 104 and with heat reservoir 108, and transfers heat from heat load 104 to heat reservoir 108. This structure is shown only as an example, any architecture may be used in which the geometry is arranged so that the nanotube fabric can transfer heat from a (hotter) thermal load to a (cooler) thermal reservoir, and the nanotube fabric has a size, shape, and nanotube density (e.g., thickness) selected to transfer a sufficient amount of heat from the thermal load to the thermal reservoir. For example, a fabric used to cool a conventional integrated circuit would generally have a size and shape sufficient to cover the parts of the integrated circuit that need cooling, and the fabric would have enough nanotubes (of the correct type) to transfer heat from the integrated circuit to a thermal reservoir at a rate sufficient that the integrated circuit would remain at a safe operating temperature, e.g., 100-120° C.

In some embodiments a nanotube fabric is fabricated over an entire wafer surface, and then portions of the fabric are removed by patterning, thereby leaving heat-transferring portions only in desired locations. Such patterning may be accomplished by using methods such as those in the incorporated patent references. FIG. 2A illustrates patterned photoresist 202 disposed on a section of nanotube fabric 204 overlying a substrate 206. According to one method of nanotube patterning, the exposed fabric 204 and the resist 202 are exposed to an ashing procedure thereby removing the exposed nanotube fabric. The resist 202 is subsequently removed, and the patterned fabric 208 remains, as shown in FIG. 2B. FIG. 2B illustrates a patterned, relatively sparse nanotube fabric 208. In a configuration such as that shown in FIG. 1, such a fabric is capable of conducting heat away from a "hot spot" such as heat load 104, to a thermal reservoir (in some cases referred to as a "heat sink," such as thermal reservoir 106.

A second exemplary device 300 that could be used for on-chip thermal management of high heat load active regions is illustrated in FIG. 3. Device 300 has a high heat load active region 302, a low-thermal conductivity region 304 (such as silicon or silicon dioxide), a moderate to high thermal conductivity region 306 (such as an interconnect metallization layer), a nanotube fabric 308 and a thermal reservoir region 310. Fabric 308 is in thermal contact with heat load active region 302 via moderate to high thermal conductivity region 306, and with thermal reservoir region 310. In operation, heat flows from heat load 302, through moderate to high thermal conductivity region 306, through nanotube fabric 308, and into reservoir 310. The geometry and exact relative placement of the elements of structure 300 need not be as described; one skilled in the art will understand that as long as the geometry and composition of fabric 308 is configured to lead heat away from the heat load active region 302 then the thermal transfer properties of the fabric 308 may be utilized.

Figure 4:
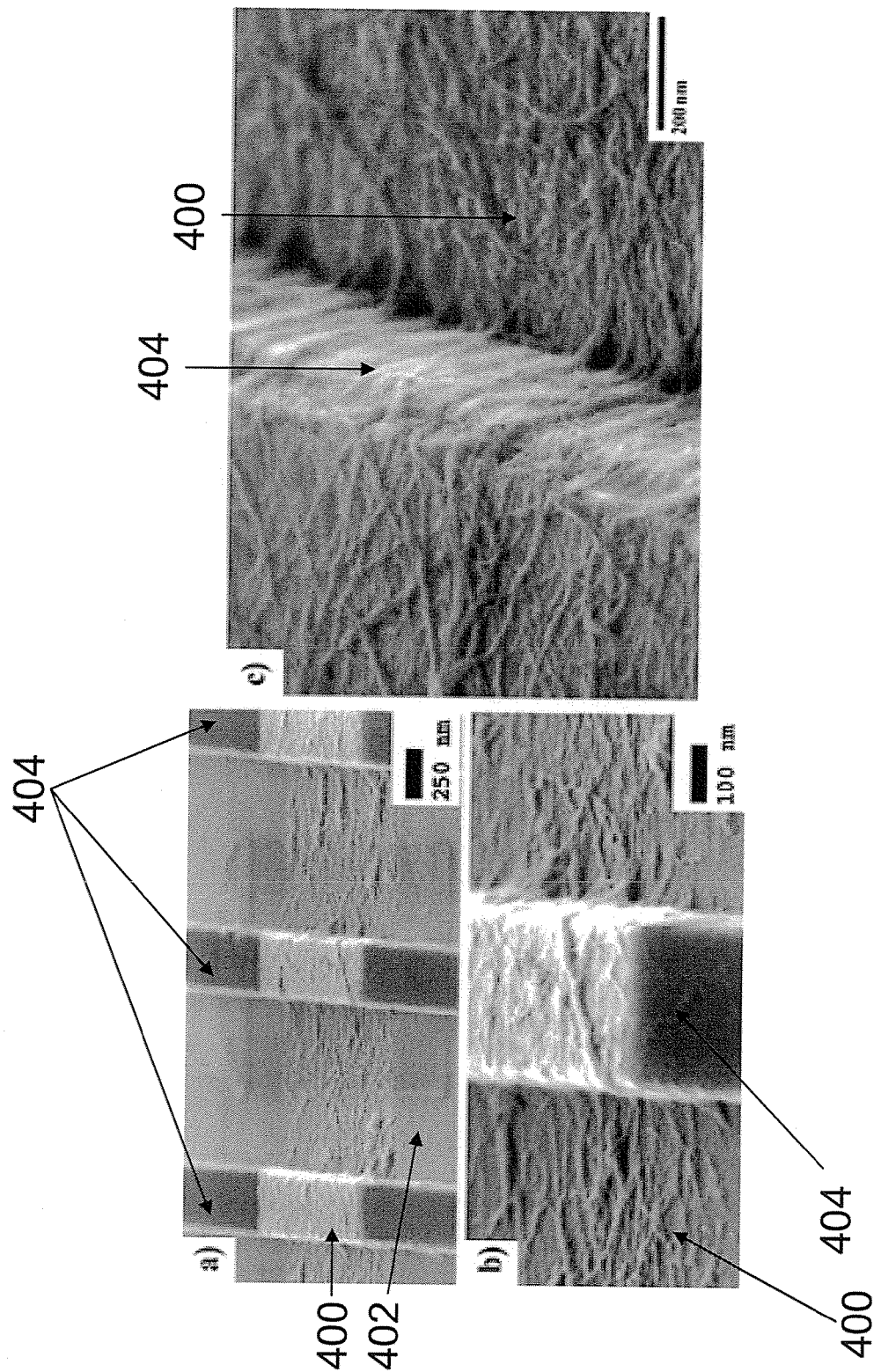
FIGS. 4A-4C are micrographs of conformal nanotube fabrics.

Nanotube fabrics and ribbons thereof have also been shown to substantially conform to a surface, such as a surface of an article on a semiconductor substrate. For example, the fabric is generally horizontally oriented when the surface of the substrate that receives the fabric is horizontally oriented, and the fabric is generally vertically oriented on a vertical surface of a suitable substrate. Fabrication techniques to develop such horizontally- and vertically-disposed fabrics and devices using such nanotube fabrics, may be created via CVD or by room temperature operations; further details may be found in the incorporated patent references. This feature allows nanotube fabrics to be used as heat transfer media on a wide variety of semiconductor substrates and features. FIGS. 4A-4C illustrate typical conformal properties of carbon nanotube fabrics. FIG. 4A is a micrograph of a patterned nanotube fabric 400 disposed upon a substrate 402 with raised features 404. FIGS. 4B and 4C are detailed micrographs of a nanotube fabric 400 conforming to a substantially vertical substrate feature 404.

CNT fabrics can also be suspended by supports above the surface of the substrate. Suspending heat transfer fabrics can enhance the ability of the fabrics to conduct heat while not being significantly influenced by the surrounding/underlying substrate since the suspension of the fabric will prevent any interaction between the substrate and the CNTs that may perturb the transfer of heat along the axis of the CNTs due to deformation caused in the tube because of the van der Waals forces present on the surface. Suspending the CNT fabric may also reduce or eliminate the possibility of the large surface area of the substrate retaining heat, which may prevent the CNT fabric from adequately transferring the heat away from the active device.

Figure 5:
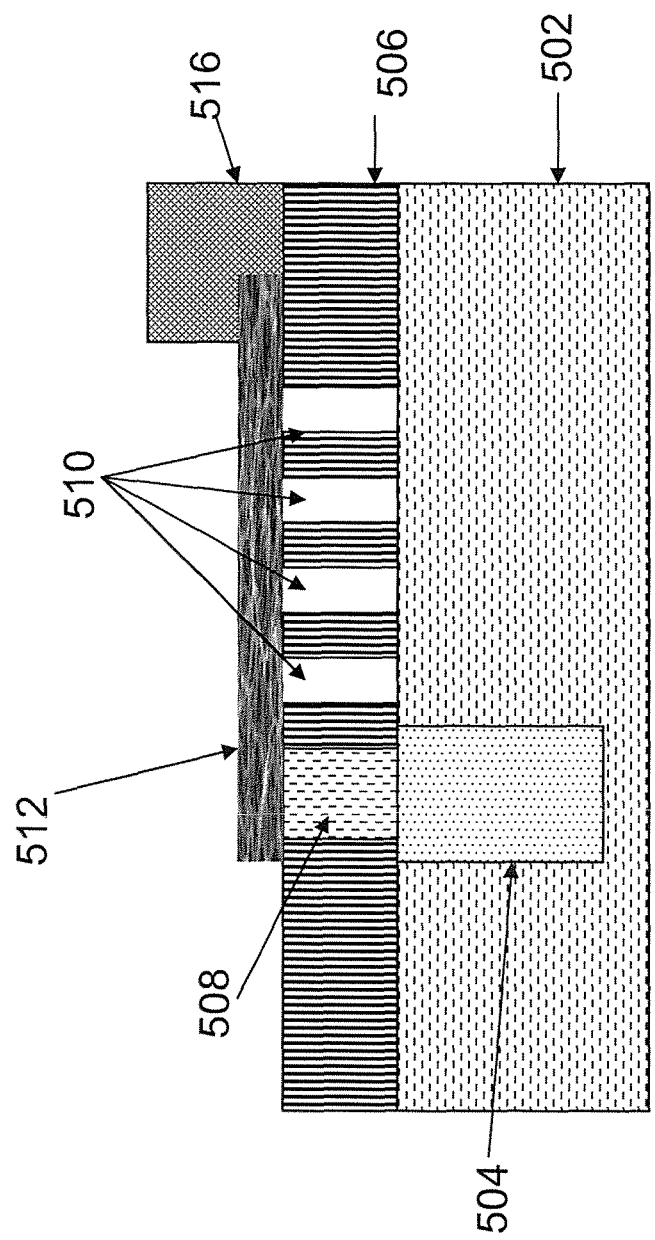
FIG. 5 illustrates an embodiment of a partially suspended heat transfer structure.

FIG. 5 illustrates an exemplary structure 500 utilizing heat transfer fabric portions that are suspended over air/vacuum gaps. Structure 500 includes a substrate 502, an active region 504, a low thermal conductivity layer 506, a moderate to high thermal conductivity region 508, air gaps 510, a suspended nanotube fabric 512 and a thermal reservoir 516. Gaps 510 are defined by supports in low thermal conductivity layer 506, beneath the nanotube fabric 512. Fabric 512 is in thermal contact with active region 504 via moderate to high thermal conductivity region 508, and with thermal reservoir region 516. In operation, heat flows from active region 504, through moderate to high thermal conductivity region 508, through nanotube fabric 512, and into reservoir 516.

As mentioned above, CNT fabrics can be applied to an entire wafer, patterned, and selected sections can be removed. Thus, heat-transfer sections can be left in desired locations to remove heat from selected sites. Therefore, any location on the chip that is highly sensitive to heat loads can have a patterned CNT heat transfer fabric applied adjacent to it in order to remove the excess heat load. Because the entire wafer surface may be covered with CNT fabric and selected portions of fabric can be removed (or even used as other electronic elements as described above), large arrays of CNT heat pipes can be fabricated in parallel. The lithography technology node used generally dictates minimum array spacing and size array size.

Figure 6:
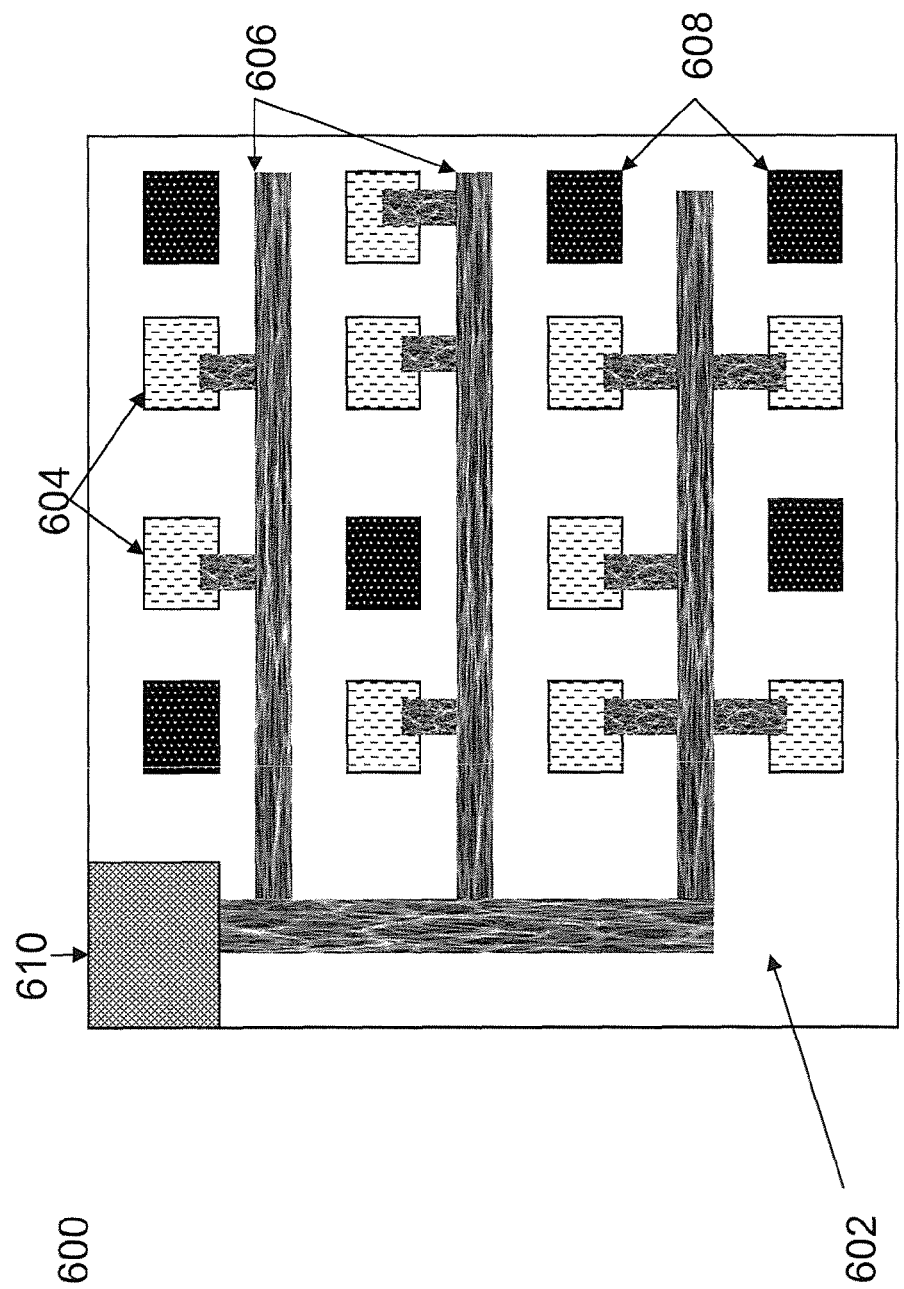
FIG. 6 illustrates an embodiment of an array heat transfer structure.

FIG. 6 is a plan view of an exemplary heat transfer fabric that has been patterned to remove heat from many selected heat sensitive sites on a wafer substrate. Structure 600 has a substrate 602, heat sensitive active regions 604, patterned CNT heat transfer fabric regions 606, non-heat sensitive active regions 608 and a thermal reservoir 610. Heat transfer fabric regions 606 are each in thermal contact with a corresponding heat sensitive active region 604, and with thermal reservoir 610. In operation, heat flows from active regions 604, through patterned CNT heat transfer fabric regions 606, and into reservoir 610.

The substrate 602 is created and heat sensitive active regions 604, non-heat sensitive active regions 608 and a thermal reservoir 610 may be deposited on or created on the substrate 602. A carbon nanotube based fabric is then created, e.g. by spin coating or by aerosol application or dipping. The fabric is then patterned, and selected regions of the fabric are removed to create patterned CNT heat transfer fabric regions 606. Nanotube fabric fabrication, patterning, and removal techniques may be found in the incorporated patent references.

Figure 7:
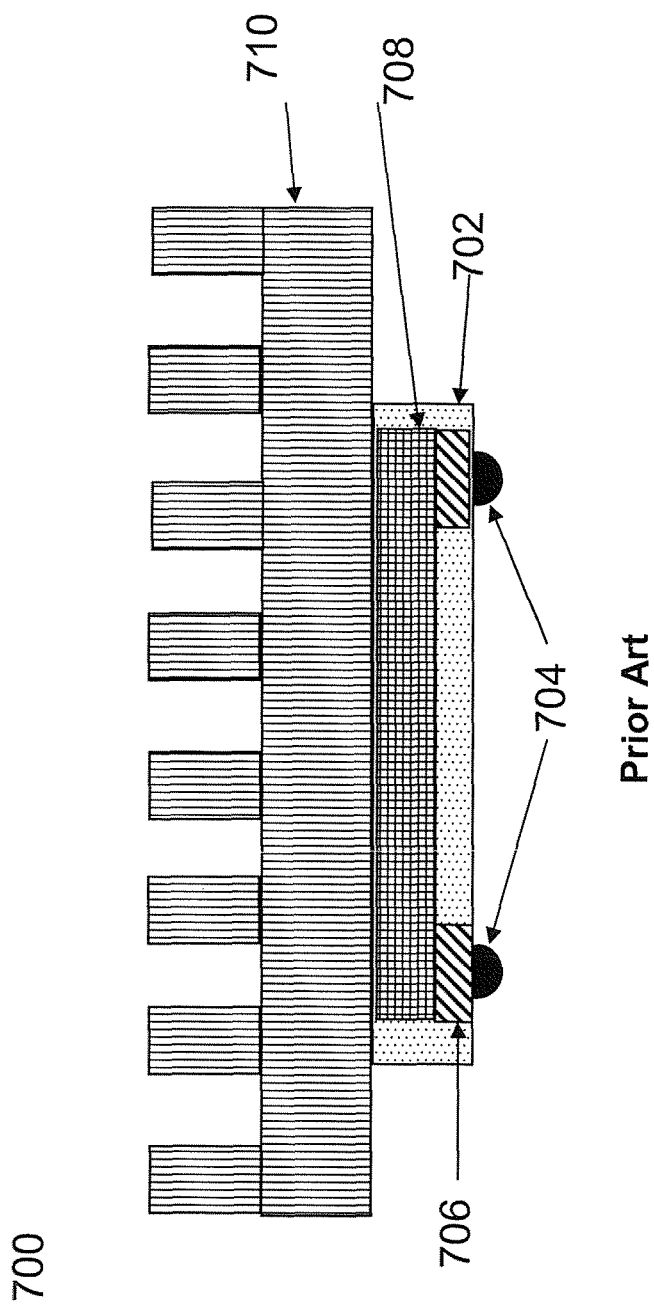
FIG. 7 illustrates a conventional heat sink on an integrated circuit.

CNT fabrics can also be employed to transfer heat from entire chips to external heat reservoirs. FIG. 7 illustrates a prior art structure used for the removal of heat from an encapsulated chip. Structure 700 includes an encapsulation material 702, terminals 704, contacts 706, a semiconductor chip 708, and a heat sink 710. Typically, "thermal grease" or another thermally conductive material is used to conduct heat between the encapsulated semiconductor chip 708 and the heat sink 710.

According to certain embodiments, nanotube fabrics, e.g., multilayered (e.g., 10-500 nm) nanotube fabrics can be used to transfer the heat from heat sensitive encapsulated areas on an electronic chip. Multilayered nanotube fabrics can be formed, e.g., by employing a spray coating process, or with other methods such as those described in the incorporated patent references. Two exemplary architectures for using a nanotube fabric to transfer heat from an encapsulated chip, e.g., an IC, are illustrated in FIGS. 8A and 8B.

Figure 8A:
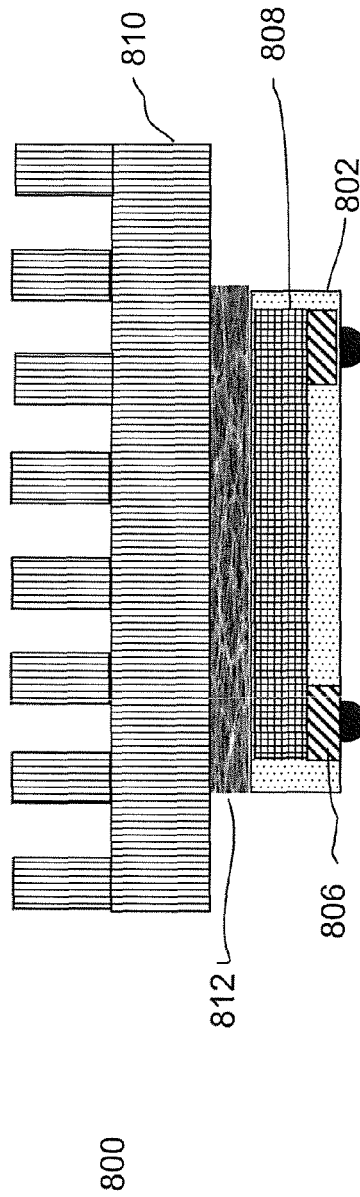
FIGS. 8A and 8B illustrate embodiments of heat transfer structures used to transfer heat from an integrated circuit.

FIG. 8A illustrates a structure 800 which includes encapsulation material 802, terminals 804, contacts 806, a semiconductor chip 808, a heat sink 810, and a heat-conducting layer of nanotubes 812. The heat-conducting layer of nanotubes 812 is disposed between the semiconductor chip 808 and the heat sink 810 so that it can carry heat from the chip to the heat sink.

Figure 8B:
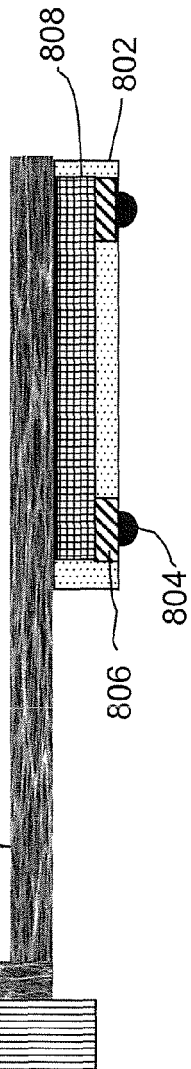

FIG. 8B illustrates another exemplary heat transfer structure 850. Structure 850 has encapsulation material 802, terminals 804, contacts 806, a semiconductor chip 808, a thermal reservoir 852, (a metal cover may be used as a thermal reservoir, for example), and a heat-conducting layer of nanotubes 854; the layer of nanotube fabric may include a supporting layer. (The supporting layer is used to support the CNT fabric until it reaches the thermal sink. The substrate (not shown in the schematic) is typically not important to the design and operation of the chip.) Note that the nanotube fabric layer in the embodiment shown in FIG. 8B has a non-planar configuration.

Figure 9:
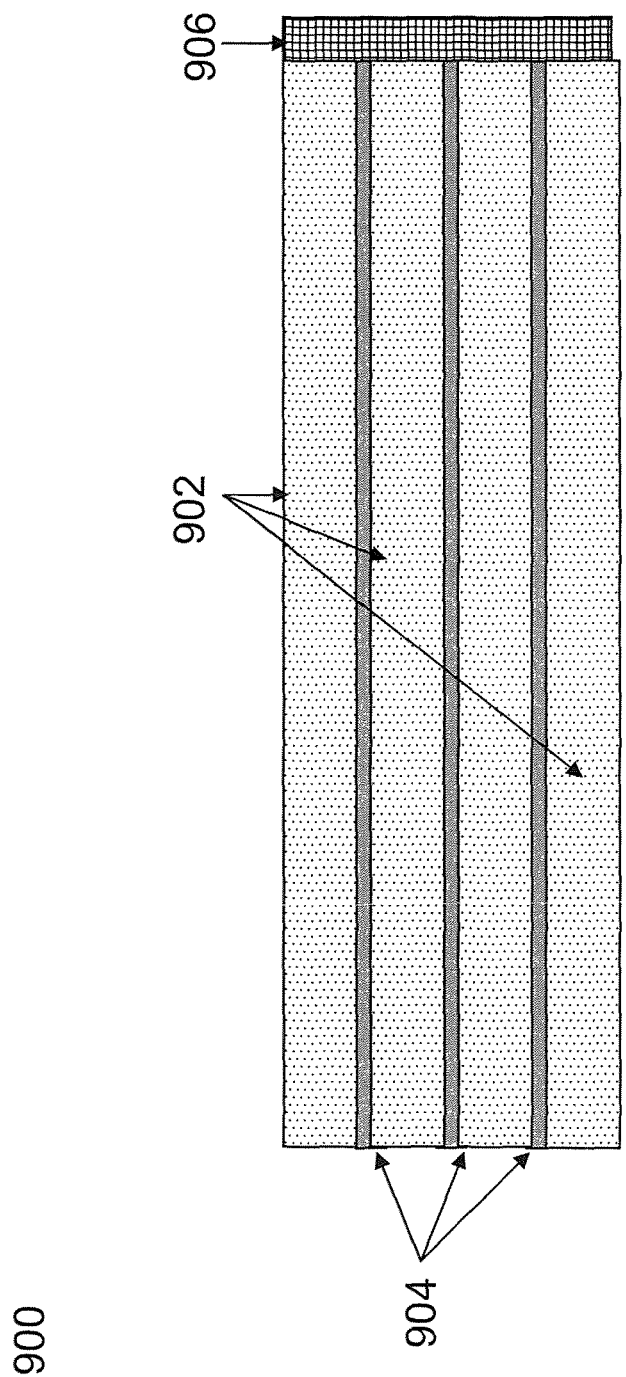
FIG. 9 illustrates an embodiment of a heat transfer structure used to transfer heat from a stack of wafers.

Nanotube fabrics can also be used to remove heat from 3-D stacked wafers. FIG. 9 illustrates a structure 900 that includes stacked chips (wafers) 902, heat transfer fabric layers 904 and a thermal reservoir 906. As can be seen in FIG. 9, the fabric layers 904 are disposed between, and preferably in thermal contact with, overlying and underlying (where applicable) stacked chips 902. The stacked chips 902 are shown in contact with a thermal reservoir 906, however the chips 902 need not be in such contact. The fabric heat transfer layers 904 are in thermal contact with the thermal reservoir 906, and conduct heat from the stack of wafers into the thermal reservoir 906.

When the heat transfer fabric is used with 3-D stacked wafers, the CNT fabric may be deposited in-between the wafers for example by spin-coating or spray-coating. The CNT fabric will then transfer any excess heat away from the mid-regions of the stack to an external thermal reservoir. The use of CNTs is advantageous over other thermal management technologies such as Cu in that the CNTs typically do not react with the surrounding substrates and therefore will not contaminate the sensitive electronics, are easily deposited, and have adjustable thickness that can be quite thin, e.g., a few nanometers.

Other Embodiments

The heat conduction properties of the nanotube fabrics may be altered by tailoring the composition, size, shape, and/or geometry of the CNT fabric. For example, thicker and denser fabrics will generally conduct more total heat than sparser fabrics, and wider fabrics will generally conduct more heat than narrower fabrics of the same density. Three-dimensional parameters of the fabrics may affect their thermal transport properties as well. The materials that contact the nanotube fabrics will also have an effect on heat transfer and/or dissipation. The heat conduction properties are also controllable and therefore tailorable by altering the composition of the nanotubes (i.e. SWNTs and MWNTs), etc. The heat conduction properties of individual CNTs can be altered by functionalization, e.g., to restrict or enhance the transport of heat from the thermal load. Investigators have shown that functionalization of single-walled carbon nanotubes drastically reduces their thermal conductivities, see Padgett et al., "Influence of Chemisorption on the Thermal Conductivity of Single-Wall Carbon Nanotubes," Nano Letters, 4 (6), 1051-1053, 2004, the entire contents of which are incorporated herein by reference. This can be a useful feature in cases where there are some areas on a given wafer that do not require rapid transport of heat away from an active region.

There are several possible commercial applications for this product. One such application would be to regulate the amount of heat that is stored at selective regions on the chip. A second application involves the removal of large amounts of thermal power from encapsulated chips and a third possible product would involve the removal of heat from 3-D stacked wafers.

Though most of the disclosure above is written as if the fabric were made of nanotubes of the same type, e.g., all single-walled, the fabrics may be composed of all multi-walled nanotubes or of a combination of single- and multi-walled nanotubes.

The above-described embodiments of nanotube-based heat transfer elements use traces of electrically conductive articles made from nanotube layers 106, such as those shown in FIGS. 1 and 2. The layers may have a minimum thickness of about 10 nm or less, i.e., the thickness of a given nanotube, and a typical thickness of about 50 nm. Thicknesses greater than 50 nm are useful and the thickness is determined based on the end use of the given transfer fabric. The fabrics may be patterned to a minimum dimension of 150 nm with a maximum width of several microns. The wider fabrics will give a higher heat transfer rate due to the expected higher thermal conductivity of the redundant tubes. Another important parameter includes the number of nanotubes in the fabric. Higher nanotube densities will give a higher overall thermal conductivity of the system due to the combined effect of the individual nanotubes. The thermal transfer length is also important. Minimum lengths of several hundred nanometers may provide superior heat transfer properties, while the thermal conductivity of the system may be expected to decrease with lengths up to several microns, due to serial connection of nanotubes, causing perturbations in the transport of heat. Heat transfer may depend on the thickness of the nanotube fabric as well, with thicknesses in the range of 10-100 nm being envisioned for various applications. The nanotube matte is grown or deposited on a surface, such as that of a silicon wafer, to form a contiguous film of a given density. The same two dimensional film that may be patterned into discrete heat transfer elements can also be patterned to generate conductively interconnecting traces ranging in width from 1 nm (the intrinsic minimum size of a nanotube) to hundreds of microns or greater, depending on the application and context, as well as other electronic elements as described in incorporated references, including, but not limited to: transistors, triodes and memory elements.

Heat Transfer Elements with Dielectric Patterning

Heat transfer elements may be formed from a single layer of conducting nanotube fabric where certain portions of the fabric are caused to become insulating while leaving other portions conductive. Further details on patterning dielectric features into nanotube fabrics may be found in U.S. patent application Ser. No. 11/398,126.

The following commonly-owned patent references, referred to herein as "incorporated patent references," describe various techniques for creating nanotube elements (nanotube fabric articles and switches), e.g., creating and patterning nanotube fabrics, and are incorporated herein by reference in their entireties:

U.S. patent application Ser. No. 09/915,093, Electromechanical Memory Array Using Nanotube Ribbons and Method for Making Same, filed Jul. 25, 2001, now U.S. Pat. No. 6,919,592;

U.S. patent application Ser. No. 09/915,173, Electromechanical Memory Having Cell Selection Circuitry Constructed with Nanotube Technology, filed Jul. 25, 2001, now U.S. Pat. No. 6,643,165;

U.S. patent application Ser. No. 09/915,095, Hybrid Circuit Having Nanotube Electromechanical Memory, filed Jul. 25, 2001, now U.S. Pat. No. 6,574,130;

U.S. patent application Ser. No. 10/033,323, Electromechanical Three-Trace Junction Devices, filed Dec. 28, 2001 now U.S. Pat. No. 6,911,682;

U.S. patent application Ser. No. 10/802,900, Electromechanical Three-Trace Junction Devices, filed Mar. 17, 2004;

U.S. patent application Ser. No. 10/033,032, Methods of Making Electromechanical Three-Trace Junction Devices, filed Dec. 28, 2001, now U.S. Pat. No. 6,784,028;

U.S. patent application Ser. No. 10/128,118, Nanotube Films and Articles, filed Apr. 23, 2002, now U.S. Pat. No. 6,706,402;

U.S. patent application Ser. No. 10/128,117, Methods of Nanotube Films and Articles, filed Apr. 23, 2002 now U.S. Pat. No. 6,835,591;

U.S. patent application Ser. No. 10/864,186, Non-Volatile Electromechanical Field Effect Devices and Circuits Using Same and Methods of Forming Same, filed Jun. 9, 2004, now U.S. Patent Publication No. 2005/0062035;

U.S. patent application Ser. No. 10/341,005, Methods of Making Carbon Nanotube Films, Layers, Fabrics, Ribbons, Elements and Articles, filed Jan. 13, 2003;

U.S. patent application Ser. No. 10/341,055, Methods of Using Thin Metal Layers To Make Carbon Nanotube Films, Layers, Fabrics, Ribbons, Elements and Articles, filed Jan. 13, 2003;

U.S. patent application Ser. No. 10/341,054, Methods of Using Pre formed Nanotube Films, Layers, Fabrics, Ribbons, Elements and Articles, filed Jan. 13, 2003;

U.S. patent application Ser. No. 10/341,130, Carbon Nanotube Films, Layers, Fabrics, Ribbons, Elements and Articles, filed Jan. 13, 2003;

U.S. patent application Ser. No. 10/776,059, Electromechanical Switches and Memory Cells Using Horizontally-Disposed Nanofabric Articles and Methods of Making Same, filed Feb. 11, 2004;

U.S. patent application Ser. No. 10/776,572, Electromechanical Switches and Memory Cells Using Vertically-Disposed Nanofabric Articles and Methods of Making the Same, filed Feb. 11, 2004 now U.S. Pat. No. 6,924,538;

U.S. patent application Ser. No. 10/917,794, Nanotube-Based Switching Element, filed Aug. 13, 2004;

U.S. patent application Ser. No. 10/918,085, Nanotube-Based Switching Elements With Multiple Controls, filed Aug. 13, 2004;

U.S. patent application Ser. No. 10/936,119, Patterned Nanoscopic Articles and Methods of Making the Same, filed Sep. 8, 2004, now U.S. Patent Publication No. 2005/0128788; and U.S. patent application Ser. No. 11/398,126, Nanotube Articles with Adjustable Conductivity and Methods of Making the Same, filed Apr. 5, 2006.

It will be further appreciated that the scope of the present invention is not limited to the above-described embodiments, but rather is defined by the appended claims, and that these claims will encompass modifications of and improvements to what has been described.

What is claimed is:

1. A heat conduction element for cooling a circuit element, comprising:

a thermal reservoir having a temperature lower than an operating temperature of said circuit element; and a nanotube article in thermal contact with said circuit element and said thermal reservoir;

wherein said nanotube article comprises a non-woven fabric of nanotubes in contact with other nanotubes to define a plurality of thermal pathways along said nanotube article;

wherein said nanotube article has a nanotube density and a geometry selected such that said nanotube article is capable of transferring heat from said circuit element to said thermal reservoir.

2. The heat conduction element of claim 1 wherein said nanotube article is formed by depositing pre-formed nanotubes on a surface so as to form a non-woven fabric of nanotubes.

3. The heat conduction element of claim 2 wherein depositing said pre-formed nanotubes comprises at least one of spin-coating pre-formed nanotubes and spray-coating pre-formed nanotubes.

4. The heat conduction element of claim 1 wherein said nanotube article is formed by growing nanotubes on a surface so as to form a non-woven fabric of nanotubes.

5. The heat conduction element of claim 1 wherein said geometry of said nanotube article is defined lithographically.

6. The heat conduction element of claim 5 wherein defining the shape of the nanotube article lithographically comprises forming a non-woven fabric of nanotubes and subsequently removing selected portions of that non-woven fabric of nanotubes in accordance with the shape.

7. The heat conduction element of claim 1 wherein said nanotube article is formed conformably said circuit element.

8. The heat conduction element of claim 1 wherein said nanotube article has a substantially planar shape.

9. The heat conduction element of claim 1 further comprising a substrate element having a substantially planar major surface and a feature not in the plane of the major surface, and wherein said nanotube article substantially conforms to said feature.

10. The heat conduction element of claim 1 further comprising support elements under said nanotube article, said support elements defining a gap over which said nanotube article is suspended.

11. The heat conduction element of claim 1 wherein the nanotube density and geometry are selected such that the nanotube article is capable of transferring heat from the circuit element to the thermal reservoir at a pre-defined rate selected to maintain the circuit element below a pre-specified temperature.

12. The heat conduction element of claim 1 wherein said pre-specified temperature comprises an upper limit of a normal operating temperature.

13. The heat conduction element of claim 1 wherein said nanotube article has a pre-defined composition.

14. The heat conduction element of claim 13 wherein said pre-defined composition includes single-walled nanotubes.

15. The heat conduction element of claim 13 wherein said pre-defined composition includes multi-walled nanotubes.

16. The heat conduction element of claim 1 wherein said circuit element comprises at least a portion of an integrated circuit.

17. The heat conduction element of claim 1 wherein said circuit element comprises an encapsulation material.

18. The heat conduction element of claim 1 wherein said thermal reservoir comprises a heat sink.

19. The heat conduction element of claim 18 wherein said heat sink comprises a plurality of fins that radiate heat.

20. The heat conduction element of claim 1 further comprising a thermally conductive material between and in thermal contact with each of said nanotube article and said circuit element.

* * * * *